United States Patent
Fujimori

(10) Patent No.: US 6,326,912 B1
(45) Date of Patent: Dec. 4, 2001

(54) ANALOG-TO-DIGITAL CONVERSION USING A MULTI-BIT ANALOG DELTA-SIGMA MODULATOR COMBINED WITH A ONE-BIT DIGITAL DELTA-SIGMA MODULATOR

(75) Inventor: Ichiro Fujimori, San Diego, CA (US)

(73) Assignee: AKM Semiconductor, Inc., San Diego, CA (US)

( * ) Notice: Subject to any disclaimer, the term of this patent is extended or adjusted under 35 U.S.C. 154(b) by 0 days.

(21) Appl. No.: 09/405,885

(22) Filed: Sep. 24, 1999

(51) Int. Cl.$^7$ ....................................................... H03M 3/00
(52) U.S. Cl. ......................... 341/143; 341/144; 341/170; 341/155; 341/172; 341/110; 341/126
(58) Field of Search ............................... 341/143, 76, 172, 341/150, 144, 110, 126, 155, 50; 364/724

(56) References Cited

U.S. PATENT DOCUMENTS

| | | |
|---|---|---|
| 4,851,841 | 7/1989 | Sooch . |
| 4,920,544 | 4/1990 | Endo et al. . |
| 5,061,928 | 10/1991 | Karema et al. . |
| 5,148,166 | 9/1992 | Ribner . |
| 5,157,395 * | 10/1992 | Del Signore et al. ................ 341/143 |
| 5,196,850 | 3/1993 | Duffy et al. . |
| 5,257,026 * | 10/1993 | Thompson ............................ 341/118 |
| 5,274,375 * | 12/1993 | Thompson ............................ 341/143 |
| 5,357,252 * | 10/1994 | Ledzius et al. ....................... 341/143 |
| 5,654,711 | 8/1997 | Fujimori . |
| 5,760,722 * | 6/1998 | Harris et al. ......................... 341/143 |
| 5,821,891 * | 10/1998 | Shi et al. .............................. 341/143 |
| 6,144,328 * | 11/2000 | Eastty et al. ......................... 341/143 |
| 6,271,782 * | 8/2001 | Steensgaard-Madsen ........... 341/143 |

OTHER PUBLICATIONS

Fujimori et al., "A Fifth–Order Delta–Sigma Modulator with 110 dB Audio–Band Dynamic Range," Audio Engineering Society, Oct. 1992, 13 pgs.

Schreier, "Mismatch–Shaping Digital–to–Analog Conversion," Audio Engineering Sociaty, Sep. 1997, 15 pgs.

* cited by examiner

Primary Examiner—Michael Tokar
Assistant Examiner—Lam T. Mai
(74) Attorney, Agent, or Firm—Kevin L. Daffer; Conley, Rose & Tayon P.C.

(57) ABSTRACT

An analog-to-digital converter is provided for converting an analog signal to a one-bit digital bit stream. The A/D converter uses a multi-bit analog delta-sigma modulator coupled to receive the analog input signal, and a one-bit digital delta-sigma modulator coupled to receive the digital output from the multi-bit analog delta-sigma modulator. The analog delta-sigma modulator uses a multi-bit quantizer having minimal quantization noise, and the digital delta-sigma modulator converts the multi-bit quantizer output into a single bit delta-sigma digital format compatible with digital audio systems which require a one-bit delta-sigma format. Thus, the present A/D converter uses the benefits of a multi-bit quantizer, yet can produce a one-bit, delta-sigma modulator output. In addition to linking with the one-bit delta-sigma modulator, the multi-bit quantizer output can be fed directly into a digital audio system which uses a multi-bit encoded delta-sigma or PCM format.

20 Claims, 3 Drawing Sheets

ANALOG-TO-DIGITAL CONVERSION USING A MULTI-BIT ANALOG DELTA-SIGMA MODULATOR COMBINED WITH A ONE-BIT DIGITAL DELTA-SIGMA MODULATOR

BACKGROUND OF THE INVENTION

1. Field of the Invention

This invention relates to an analog-to-digital ("A/D") converter and method thereof. The A/D converter employs delta-sigma modulation and more particularly a front-end, multi-bit delta-sigma modulator coupled directly or indirectly to a back-end-single bit delta-sigma modulator.

2. Description of the Related Art

A/D converters are generally known as any device which can convert an analog signal to a digital signal. A typical A/D converter is one which quantifies the incoming analog signal magnitude at various time slices or sampling periods. The quantizer may include a comparator which compares voltage levels of the incoming analog signal and produces an encoded digital output. The sampling rate can be the Nyquist rate or a rate much higher than the Nyquist rate, often known as an "oversampling" rate.

A/D converters which use an oversampling modulator are often known as delta-sigma converters. While a delta-sigma converter is inherently an oversampling converter, oversampling is just one of the techniques contributing to its overall performance. The oversampling modulator, or delta-sigma modulator, preferentially shapes the frequencies of the quantizer-induced noise so that the majority of noise lies between the Nyquist rate and the oversampling rate, and only a small portion is left in the frequency band of interest (i.e., between DC and the Nyquist rate). In this manner, a rather simplistic digital filter can easily remove a bulk of the quantization noise energy, leaving a significantly enhanced signal-to-noise ratio.

Various components are used to form a delta-sigma modulator. Those components include an integrator, a quantizer, and a D/A converter in the feedback loop from the quantizer to a summing node at the input of the integrator. The integrator functions as a low pass filter on the base band signal and a high pass filter on the quantizer noise. The quantizer provides gain and noise along with its normal A/D function. Coupled to receive the digital signal output from the quantizer is a digital filter which removes the quantization noise produced by the quantizer. The filter may have a decimator which decimates the sampled frequency back to the original Nyquist rate. Conversely, the filter may have an interpolator which increases the sampling frequency. There are many types of digital filters which operate exclusively in the digital domain, popular forms of such filters are finite impulse response ("FIR") filters, infinite impulse response ("IIR") filters, comb filters, etc. Decimation or interpolation can be included with or separate from the filter.

The delta-sigma modulator can be fairly simplistic in its architecture or rather complex depending on its targeted application. For example, the delta-sigma modulator can employ feedback to a single summing node at the input of a single integrator, or feedback to multiple summing nodes at the inputs of multiple integrators to form a first order modulator, a second order modulator, etc. An example of a first and second order delta-sigma modulator is shown in U.S. Pat. No. 4,851,841 (herein incorporated by reference). Inclusion of feedback to more than one summing node provides stability to the overall architecture. The presence of a gain scaling factor in the feedback loop to each of the summing nodes is also beneficial in avoiding overload, but at the expense of increased quantization noise. Modem delta-sigma converters attempt to minimize overload by utilizing a "cascaded" arrangement. A cascaded delta-sigma modulator is defined as a modulator having more than one stage of single or multiple-order integrators cascaded together. An interstage summing node is typically used between the stages, and serves to scale down the analog feedback signal. As a result, the level of data, noise, or both, applied to the input of the subsequent stage is maintained at a level necessary to minimize overload upon that stage, and forces the second stage integrator and quantizers to operate in a more linear range. Additionally, a noise cancellation circuit can be used to receive the outputs from both stages. The output of the first stage is summed with a single digital differentiator of the second stage output, and so on for each stage of the multi-stage modulator. The result is that the quantization noise of the first stage is suppressed by the second stage, and the quantization noise of the second stage is suppressed by the third stage. Examples of cascaded delta-sigma modulators are described in U.S. Pat. Nos. 5,654,711; 5,148,166; 4,920,544; and 5,061,928 (each of which are herein incorporated by reference).

In the context of most of the aforementioned delta-sigma modulators, regardless of whether they are single or multi-stage, the modulators typically produce a single bit, serial data stream of digital pulses representing the changing magnitudes of the incoming analog signal. Those pulses are known to exist in a delta-sigma format, where the number of positive pulses compared to negative pulses indicate the relative change in the incoming analog signal voltage magnitude. If, for example, the majority of pulses are positive ("1") rather than negative ("0"), then it is noted that the analog signal is currently near the positive rail. If there are more 0s than 1s, then the analog signal voltage magnitude is closer to the negative voltage rail.

Delta-sigma modulators which produce a one-bit digital signal as a continuous stream of delta-sigma modulated pulses are known as those which employ a one-bit quantizer. Moreover, a delta-sigma modulator which receives an analog signal is known as an analog delta-sigma modulator. Until recently, the most popular form of delta-sigma modulator was the analog delta-sigma modulator which produces a one-bit digital signal from the analog input, henceforth referred to as a one-bit, analog delta-sigma modulator.

A one-bit analog delta-sigma modulator is known to have optimal linearity since the D/A in the feedback loop has only two levels, which makes a one-bit analog delta-sigma modulator inherently linear regardless of its quantization threshold positions. Needing only two levels of quantization, the threshold between those levels need not be accurately positioned because it is preceded by the high DC gain of the integrator. More recent quantizers, however, are multi-level quantizers. A multi-level quantizer, often known as a multi-bit quantizer, has several thresholds and corresponding level spacings. For example, a multi-bit quantizer can use a high-speed flash converter which assigns one comparator for each possible level. The comparator outputs are encoded into an appropriate binary word representative of a multi-bit digital signal. Thus, instead of having a one-bit output, a multi-bit quantizer produces numerous bits forwarded in parallel across corresponding conductors of a multi-conductor bus.

A multi-bit quantizer, or multi-bit analog delta-sigma modulator can, unfortunately, introduce non-linearity directly into the feedback signal, unless the non-linearity is treated. The non-linearity is primarily caused by misplaced levels in the D/A converter feedback loop. The misplaced levels force the encoded digital output to improperly map to an analog signal magnitude. While multi-bit quantizers have many advantages such as lower quantization noise, more stability, and lower complexity needed of the digital decimation filter, multi-bit quantizers may induce non-linear gain and, more importantly, non-linearity into the incoming analog signal itself. There currently exists several strategies for dealing with realizing a more linear D/A converter in the feedback path. For example, the D/A converter can be made of components external to the mixed signal integrated circuit embodying the delta-sigma modulator. Alternatively, critical elements of the D/A converter can be trimmed to ensure their accuracy and compatibility. Another method, often referred to as dynamic element matching, is to apply additional signal processing to the multi-bit data so that the errors introduced by the D/A converter imperfections are randomized (i.e., destroy the correlation between the signal and the D/A noise) and/or noise shaped. There are various algorithms used for achieving this result, as set forth in R. Schreier, "Mismatch-Shaping Digital-to-Analog Conversion," *Audio Engineering Society* (incorporated herein by reference).

It would be desirable to take advantage of multi-bit quantizers since quantization noise imputed by the quantizer decreases exponentially with the number of bits used in the quantizer. Thus, every additional bit used in the quantizer significantly reduces the quantizer noise and lessens the complexity of both the modulator (i.e., orders and stages) and the digital decimation filter.

It is to be noted, however, that while some digital audio formats can accept an encoded multi-bit delta-sigma signal, other formats require a single bit delta-sigma signal. For example, Super Audio Compact Discs ("SACDs") requires a recording process known as Direct Stream Digital ("DSD"), which uses the same delta sigma modulation single bit digital data stream to achieve a high-quality sonic output. The delta-sigma format used by SACD is a digital data stream that transitions at a rate of 44.1 KHz×64, or 2.822 MHz. Other digital audio systems, such as DVD Audio Discs merely require a multi-bit Pulse Code Modulated ("PCM") format, preferably 24-bit PCM, transitioning at 48 KHz, or multiples thereof. It would be desirable to implement an improved A/D converter which can accommodate a super audio CD format employing a one-bit delta-sigma modulated bit stream while using a multi-bit quantizer. It may also be desirable to accommodate both the super audio CD format and the DVD audio format on a single, mixed-signal integrated circuit with outputs dedicated to each of these formats.

SUMMARY OF THE INVENTION

The problems outlined above are in large part solved by an improved, mixed-signal integrated circuit. The integrated circuit is one which has pins capable of receiving an analog signal. The integrated circuit also has a single output pin upon which a digital signal is presented as a serial bit stream modulated according to a delta-sigma format. Other output pins may be present and dedicated to presenting a multi-bit PCM and/or delta-sigma format. In this manner, the improved integrated circuit can be used to produce differing digital audio formats while employing a multi-bit quantizer and the advantages thereof.

The present integrated circuit is an A/D converter. The A/D converter preferably uses a multi-bit analog delta-sigma modulator adapted for receiving an analog signal forwarded to an input pin of the integrated circuit. A multi-bit analog delta-sigma modulator converts the analog signal to an encoded, multi-bit digital signal which can then either be presented at an output of the integrated circuit as a multi-bit digital output, or can be fed to a one-bit digital delta-sigma modulator. The digital delta-sigma modulator serves to convert the incoming, multi-bit digital signal into a one-bit digital signal. Importantly, the one-bit digital signal is in delta-sigma modulated format recognizable to, for example, super audio CDs.

The combination of a multi-bit analog delta-sigma modulator and a one-bit digital delta-sigma modulator poses many advantages. One advantage is use of a multi-bit quantizer in the analog delta-sigma modulator. The multi-bit quantizer not only operates with lessened quantization step size but, more importantly, produces drastically reduced quantization noise in the feedback signal. The digital decimation filter which can be embodied upon the integrated circuit or separate from the integrated circuit can correspondingly be made less complex than digital filters needed to remove single bit quantizer noise. The lowered quantization noise allows for a lowering of the oversampling rate ("OSR"), which translates to a lower operation speed in the digital filter—also adding to a less complex digital filter, and/or a filter which is smaller and consumes less power. The smaller quantizer step size and lowering of the OSR greatly reduces slew rate requirements for the opamp, which thereby reduces power consumption in the analog portion (analog delta-sigma modulator) of the mixed signal integrated circuit. The added overhead of employing a digital delta-sigma modulator is minimal. Components needed to realize a digital delta-sigma modulator are readily attainable and easily achievable using various counters, accumulators, adders, etc. generally known in digital circuit fabrication. Thanks to relatively fine-line geometries provided in modern fabrication facilities, relatively large digital portions can be reduces to minimal substrate area. The digital processing for the dynamic element matching of the multi-bit D/A converter also requires minimal area. Thus, the addition of a digital delta-sigma modulator consumes minimal space on the mixed-signal integrated circuit and imputes minimal noise onto the analog sampling portion of the mixed-signal integrated circuit. A multi-bit quantizer within the analog delta-sigma modulator poses minimal added overhead when compared to a one-bit quantizer within the analog delta-sigma modulator. Accordingly, the present combination of a multi-bit, analog delta-sigma modulator and a one-bit digital delta-sigma modulator achieves the advantages of reduced quantization noise, minimal circuit overhead and minimal added complexity.

According to one embodiment, an A/D converter is presented. The A/D converter includes an analog delta-sigma modulator adapted to convert an analog signal into a multi-bit digital signal. A digital delta-sigma modulator coupled to the analog delta-sigma modulator is adapted to convert the multi-bit digital signal into a one-bit digital signal. The one-bit digital signal is a continuous bit stream of delta-sigma modulated pulses. More specifically, the one-bit digital signal is a serial stream of positive and negative pulses (i.e., 1s and 0s) which transition a multiple of the Nyquist rate. The number of positive pulses increases when the modulating analog signal increases in amplitude. The A/D converter may further include at least one decimator or at least one interpolator coupled to receive the multi-bit digital signal and produce a multi-bit digital output signal which transitions at a frequency less than or more than, respectively, a transitional frequency of the multi-bit digital signal. Accordingly, the decimator or interpolator can be used to maintain or change the multi-bit digital signal format so that an outcome from the decimator or interpolator can be compatible with a multi-bit PCM format generally recognized in DVD audio. The decimator or interpolator can, alternatively, maintain the delta-sigma format, with either fewer or greater number of bits than those which enter the decimator or interpolator. A rate-change switch associated with the decimator or interpolator can modify the frequency so as to achieve compatibility with various digital audio systems coupled thereto.

According to another embodiment, a method is provided. The method may be used for converting an analog signal, and may include several steps. For example, the method may include first converting the analog signal into a multiple bit stream of delta-sigma modulated pulses. The multi-bit stream of delta-sigma modulated pulses can then be converted again into a single bit stream of delta-sigma modulated pulses. In the interim, the multi-bit stream of delta-sigma modulated pulses can be converted into a multi-bit PCM signal compatible with DVD audio. The multi-bit PCM signal may be clocked at a rate of approximately 48 KHz or integer multiples thereof. The conversion of the multi-bit stream into a single bit stream of delta-sigma modulated pulses may comprise quantizing either the multi-bit stream of delta-sigma modulated pulses or the multi-bit PCM signal into the single bit stream of delta-sigma modulated pulses compatible with audio CD.

BRIEF DESCRIPTION OF THE DRAWINGS

Other objects and advantages of the invention will become apparent upon reading the following detailed description and upon reference to the accompanying drawings in which.

Figure 1:
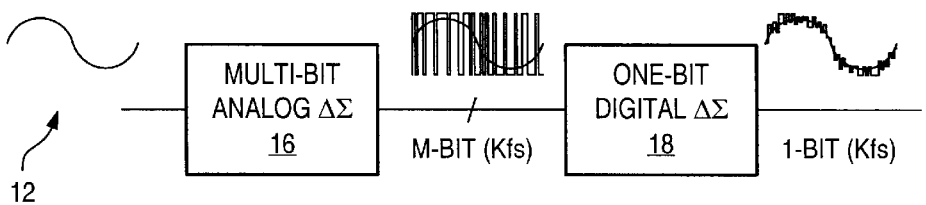
FIG. 1 is a block diagram of an A/D converter.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates an integrated circuit embodying at least a portion of an A/D converter 10. Converter 10 receives an analog signal 12 and produces a one-bit digital signal 14 presented in delta-sigma format. Digital signal 14 is a serial stream of 1s and 0s, the relative quantity of which is dependent on the magnitude of the analog signal 12.

Coupled to receive analog signal 12 is a multi-bit, analog delta-sigma modulator 16. Modulator 16 can be formed as one or more orders of integrators which may be cascaded with another stage of one or more orders of integrators. Importantly, the quantizer which produces the multi-bit output does so using a multi-bit quantization technique. Thus, the multi-bit quantizer of modulator 16 produces an encoded set of bits forwarded in parallel fashion across multiple conductors that are routed to a one-bit digital delta-sigma modulator 18. The frequency at which the multi-bit signal transitions is dependent on the sampling frequency of the multi-bit quantizer. The sampling frequency is defined as an oversampling frequency having an oversampling rate of K, whereby the multi-bit quantizer is sampled at $Kf_S$. The one-bit digital delta-sigma modulator 18 essentially takes the incoming digital signal forwarded in parallel across multiple conductors, and converts that signal into a one-bit digital output. The digital output is shown in the example of FIG. 1 as transitioning at the same rate as the multi-bit, incoming digital signal (i.e., $Kf_S$). The multi-bit analog delta-sigma modulator can be implemented with numerous orders and stages, similar to the one-bit digital delta-sigma modulator 18. Regardless of whether single or multiple orders are or are not cascaded, the outcome of the analog delta-sigma modulator is one which converts an analog signal into a single delta-sigma modulated digital bit stream while employing a multi-bit quantizer. Achieving the benefits of a multi-bit quantizer, yet producing a one-bit delta-sigma digital format provides many advantages, some of which are described above.

Figure 2:
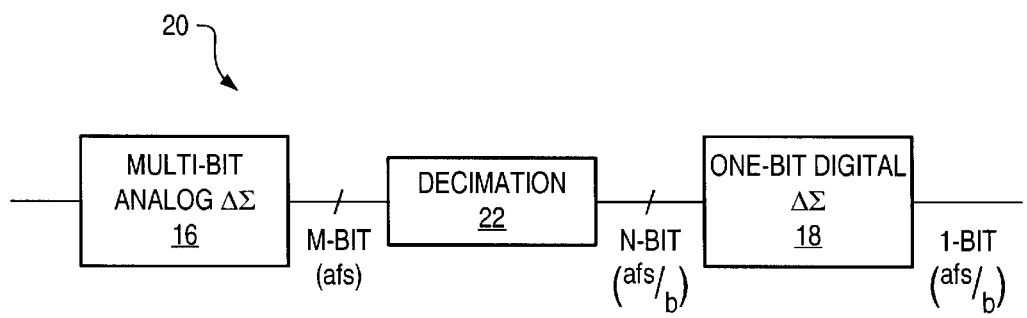
FIG. 2 is a block diagram of the A/D converter according to one embodiment.

FIG. 2 illustrates one embodiment for realizing an A/D converter. The embodiment, shown as reference numeral 20, indicates decimation 22 placed between modulators 16 and 18. Decimation 22 can be carried out by a frequency rate reduction switch used to decrease the incoming oversampling frequency $af_S$ by a factor b. Likewise, decimation 22 can also change the encoded multi-bit signal by either increasing the number of bits or decreasing the number of bits (i.e., changing M-bits to N-bits).

Figure 3:
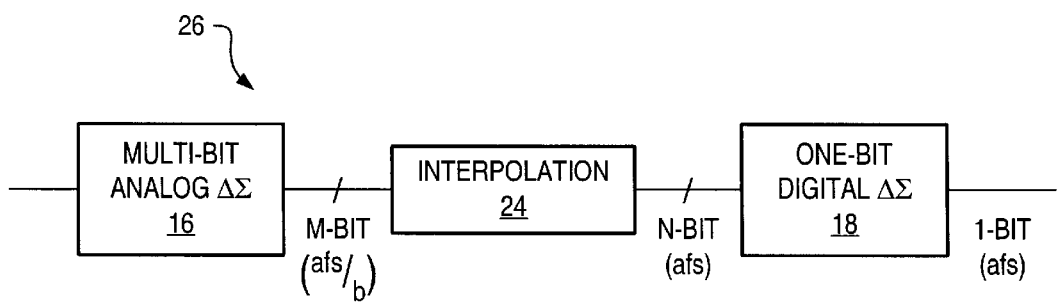
FIG. 3 is a block diagram of the A/D converter according to another embodiment.

FIG. 3 illustrates an interpolation stage 24 implemented according to an embodiment 26, as shown. Instead of decreasing the frequency prior to presentation upon modulator 18, interpolation stage 24 increases the frequency. The number of bits presented to modulator 18 can also be increased or decreased by the interpolation rate change switch within stage 24.

FIGS. 2 and 3 thereby indicate "conditioning" of the multi-bit signal prior to its placement upon the digital delta-sigma modulator 18. Regardless of whether interpolation or decimation is used, and regardless of whether the number of bits within the multi-bit encoded data stream changes, the intent shown is to provide a conditioned multi-bit data stream conducive for modulator 18 and for whatever digital system is coupled to the output of modulator 18. If, for example, a super audio CD unit is attached to the output, it may be important that factor "b" be implemented to achieve $af_S/b$ of 2.822 MHz. Interpolation or decimation may be needed to change the frequency from modulator 16 in order to achieve the 2.822 MHz frequency.

Figure 4:
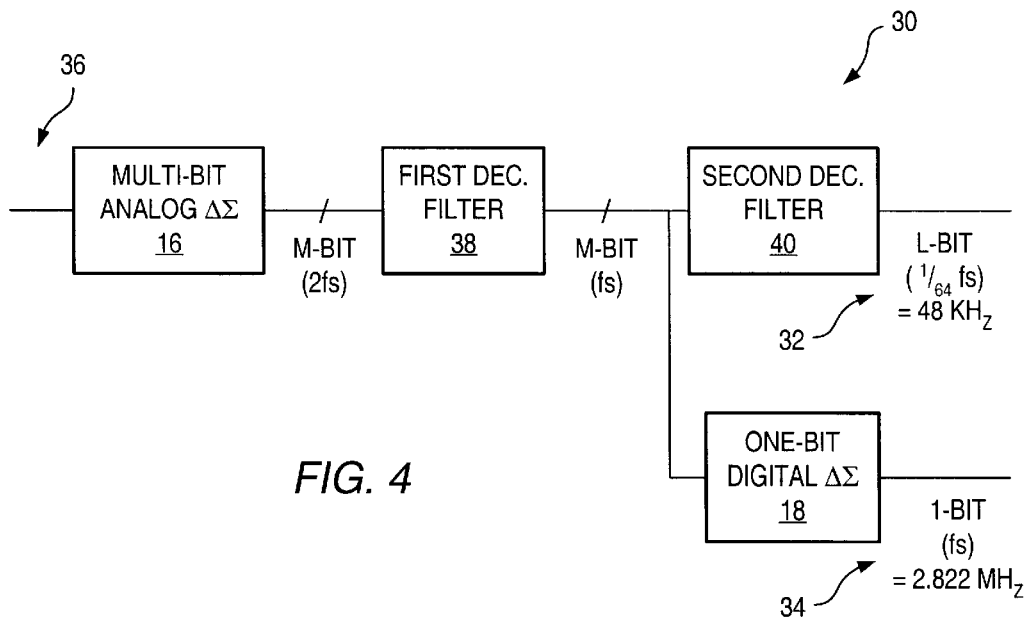
FIG. 4 is a block diagram of the A/D converter according to yet another embodiment.

FIG. 4 illustrates another embodiment of an A/D converter 30. A/D converter 30 is shown to produce two different output formats: a first format being a multi-bit delta-sigma or PCM format; a second format being a single bit stream of delta-sigma format. Specific examples are provided for each format, as shown by reference numerals 32 and 34. Converter 30 receives an analog signal 36, and converts that signal via a multi-bit analog delta-sigma modulator 18 to a multi-bit digital output. The digital output, according to one example, can be forwarded at an oversampling rate of $2f_S$, where $f_S$ is significantly greater than the Nyquist rate. A first decimator 38, possibly included with a filter, receives the multi-bit digital output from modulator 18, and produces a lower frequency multi-bit output (e.g., frequency at $f_S$). Preferably, frequency $f_S$ is that which is compatible to the desired single bit delta-sigma output produced by digital delta-sigma modulator 18. According to one example, $f_S$=2.822 MHz. If further reductions in frequency $f_S$ is needed, then another decimation filter can be used. The second decimation filter 40 performs additional decimation to achieve a lower frequency (e.g., 1/64 $f_S$, or 48 KHz). The second decimation filter 40 may also be used to re-format the incoming signal with greater or lesser number of bits and/or present an output format, such as PCM instead of a delta-sigma format.

FIG. 4 illustrates an A/D converter 30 which accommodates two differing formats presented at the output of converter 30, regardless of whether 30 is embodied on a single, mixed-signal integrated circuit or a chipset. Preferably, converter 30 is envisioned upon a single monolithic substrate with minimal overhead needed to accomplish the one-bit digital delta-sigma modulator 18. Beneficially, modulator 16 uses a multi-bit quantizer with the advantages of lower quantization noise and greater stability than one-bit quantizers. While super audio CD format can occur simply by using a single, one-bit analog delta-sigma modulator, the benefits of a lower quantization noise cannot be achieved with this arrangement and, more importantly, a one-bit analog delta-sigma modulator imposes a more stringent slew rate and settling requirement, and also necessitates gain scaling to avoid overload. By its nature, gain scaling will thereby increase quantization noise. An example of a one-bit analog delta-sigma modulator for use in super audio CD applications is set forth in an article entitled "A Fifth-Order Delta-Sigma Modulator With 110 dB Audio-Band Dynamic Range" (herein incorporated by reference).

Figure 5:
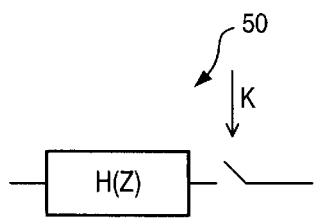
FIG. 5 is a symbolic representation of a decimation filter as shown in FIGS. 2 and 4.
Figure 6:
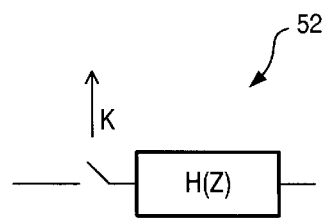
FIG. 6 is a symbolic representation of an interpolation filter as shown in FIG. 3.

FIGS. 5 and 6 illustrate a decimation filter 50 and interpolation filter 52, respectively. Both filters include a filter transfer function H(z) followed by or preceded with a rate change switch, as shown. The filter transfer function H(z) can be determined by anti-alias filtering requirements for the decimator and image rejection requirements for the interpolator.

Figure 7:
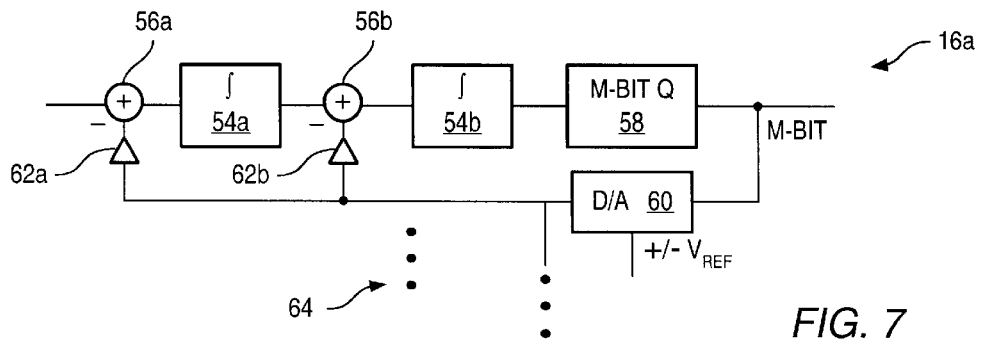
FIG. 7 is a block diagram of a multi-bit, analog delta-sigma modulator according to one embodiment.
Figure 8:
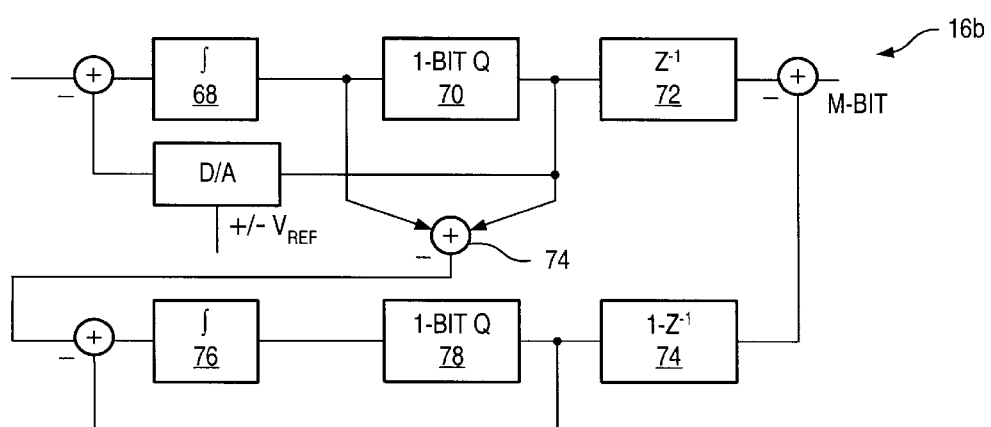
FIG. 8 is a block diagram of a multi-bit, analog delta-sigma modulator according to another embodiment.

FIGS. 7 and 8 illustrate alternative examples in which to realize a multi-bit analog delta-sigma modulator 16. The alternative examples are shown as 16a and 16b in respective FIGS. 7 and 8. Modulator 16a is shown as a second order modulator, with two integrators 54a and 54b and two preceding summing nodes, 56a and 56b. Feedback from the multi-bit quantizer 58 is forwarded through a D/A converter 60. Converter 60 essentially receives the encoded digital bits and selects a corresponding $V_{REF}$ value. The portion of $V_{REF}$ imputed on the feedback line is made proportional in magnitude to the encoded multi-bit value. Amplifiers or buffers 62 can be used to provide a gain of the feedback analog voltage value to the corresponding summing nodes.

FIG. 7 illustrates a second order, multi-bit analog delta-sigma modulator. However, as indicated by reference numeral 64, the second order modulator can be cascaded with additional stages. In its simplest form, however, modulator 16a is envisioned as a single order, non-cascaded, modulator. However, it is likely that the modulator contains more than one order in more than one stage. FIG. 8 illustrates an alternative architecture for modulator 16b utilizing a feedforward and feedback system. Thus, the output from integrator 68 can be fed forward to an inter-stage summing node 74, along with the output fed back from quantizer 70. The other components are essentially the same as those shown in modulator 16a, except that a delay element 72 is present at the output of the first stage in order to synchronize with an output from the second stage. Output from the inter-stage summing node 74 is forwarded to a subsequent stage which, in the example shown, includes a single order architecture (i.e., a single integrator 76 and a single quantizer 78). A differentiator 74 is coupled to the output of the second stage. Use of digital differentiators are generally well-known in the art.

FIGS. 7 and 8 illustrate various ways in which to arrive at a multi-bit analog delta-sigma modulator. Regardless of the architecture used, the desired outcome is to convert an analog signal into an encoded digital signal compatible with the delta-sigma format. That format is previously defined, and essentially connotes a digital encoded signal that increases in value commensurate with magnitude increases of the incoming analog signal. Thus, an encoded digital value of "5" that changes to an encoded digital value "6" indicates that the incoming analog signal magnitude had increased towards the positive rail. If the encoded signal decreases in value, then it is noted that the analog signal had decreased in value towards the negative rail. The same can apply regardless of whether the format is a multi-bit encoded digital signal or simply a serialized bit stream, where an increasing number of 1s relative to 0s indicates an increase in the analog voltage magnitude, or vice versa.

Figure 9:
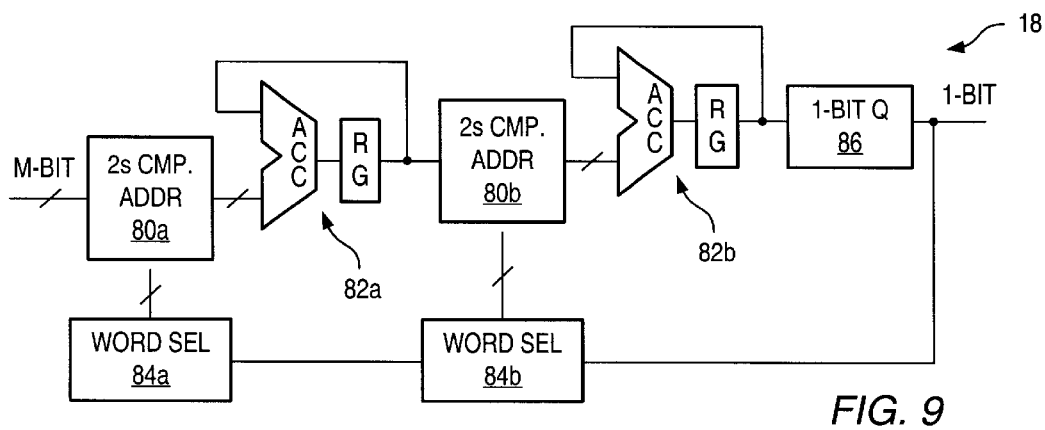
FIG. 9 is a block diagram of a one-bit, digital delta-sigma modulator according to one embodiment.

FIG. 9 is an example of a one-bit digital delta-sigma modulator 18. Modulator 18 can be implemented upon an integrated circuit in an area significantly smaller than the analog delta-sigma modulator. Specifically, front-end sampling via capacitors can be avoided in lieu of simple adders 80a and 80b, and op-amps with associated capacitors can be avoided using simple accumulators with registers 82a and 82b. Digital delta-sigma modulator 18 therefore operates entirely in the digital domain, where negation at the summing nodes can be represented as two's complement adders. Thus, each of the analog elements can be replaced with corresponding digital elements, avoiding any D/A conversion in the feedback loop, and simply using word selection units 84a and 84b to select between words based on whether the input, feedback bit stream is a 1 or 0. The two's complement adders provide subtraction, and the word selection units 84a and 84b subtract a selected multi-bit word from the incoming multi-bit digital signal based on the status of the one-bit output. Digital delta-sigma modulators are generally well-known. An example of a fourth order digital delta-sigma modulator is shown in U.S. Pat. No. 5,196,850 (herein incorporated by reference).

Instead of using a multi-bit quantizer, the digital delta-sigma modulator 18 uses a one-bit quantizer 86. The one-bit quantizer simply converts the accumulated digital values into a bit stream having a number of 1s and 0s that correspond to that accumulated value. Thus, the one-bit quantized output corresponds to the delta-sigma format attributed to the output of a one-bit analog delta-sigma modulator, except that modulator 18 which produces the one-bit delta-sigma format is derived from a digital delta-sigma modulator.

It will be appreciated by those skilled in the art having the benefit of this disclosure that the embodiments herein are believed to be capable of applications with any oversampled analog-to-digital converter. Furthermore, it is also to be understood than the embodiments shown and described are to be taken as presently preferred embodiments. Various modifications and changes may be made to each and every component as would be obvious to a person skilled in the art having the benefit of this disclosure. It is intended that the following claims be interpreted to embrace all such modifications and changes and, accordingly, the specification and drawings are to be regarded in an illustrative rather than restrictive sense.

What is claimed is:

1. An analog-to-digital converter, comprising:
   an analog delta-sigma modulator adapted to convert an analog signal into a first digital signal; and
   a digital delta-sigma modulator adapted to receive the first digital signal and produce a second digital signal having fewer bits than the first digital signal.

2. The analog-to-digital converter as recited in claim 1, wherein the second digital signal is a one-bit digital signal.

3. The analog-to-digital converter as recited in claim 2, wherein the one-bit digital signal is a continuous bit pattern of delta-sigma modulated pulses.

4. The analog-to-digital converter as recited in claim 1, wherein the second digital signal is an encoded continuous bit pattern of delta-sigma modulated pulses.

5. The analog-to-digital converter as recited in claim 1, wherein the analog delta-sigma modulator includes at least one feedback loop that includes a multi-bit quantizer or a single-bit quantizer.

6. The analog-to-digital converter as recited in claim 1, wherein the analog delta-sigma modulator is configured in a cascaded architecture.

7. The analog-to-digital converter as recited in claim 2, wherein the one-bit digital signal is a serial stream of positive and negative pulses which transition a multiple of the Nyquist rate, and wherein the number of positive pulses increase when the modulating analog signal increases in amplitude.

8. The analog-to-digital converter as recited in claim 1, further comprising at least one decimator or interpolator coupled to receive the first digital signal and produce a multi-bit digital output signal which transitions at a frequency less than or more than, respectively, a transitional frequency of the first digital signal.

9. The analog-to-digital converter as recited in claim 8, wherein the decimator or interpolator comprises a digital filter coupled in series with a rate change switch.

10. The analog-to-digital converter as recited in claim 1, wherein the analog delta-sigma modulator comprises switched capacitors which samples the analog signal along with a reference voltage.

11. The analog-to-digital converter as recited in claim 1, wherein the digital delta-sigma modulator comprises an adder which combines the first digital signal with a digital word selected by the second digital signal.

12. An analog-to-digital converter, comprising:
    an analog delta-sigma modulator adapted to convert an analog signal into a first digital signal;
    a first digital decimation filter adapted to convert the first digital signal into a digital output signal which transitions slower than the first digital signal; and
    a digital delta-sigma modulator adapted to convert the digital output signal into a second digital signal having fewer bits than the first digital signal.

13. The analog-to-digital converter as recited in claim 12, wherein the second digital signal is a one-bit digital signal.

14. The analog-to-digital converter as recited in claim 12, wherein the first digital decimation filter comprises a rate change switch operably coupled to reduce the frequency and re-format the first digital signal into a pulse code modulated said second digital signal compatible with DVD audio.

15. The analog-to-digital converter as recited in claim 12, further comprising a second digital decimation filter adapted to convert the first digital output signal into a lower frequency multi-bit digital output signal compatible with DVD audio.

16. The analog-to-digital converter as recited in claim 12, wherein the second digital signal is a continuous bit pattern of delta-sigma modulated pulses compatible with super audio CD.

17. The analog-to-digital converter as recited in claim 12, wherein the first digital decimation filter is coupled to change the clocking rate and/or format of the first digital signal, with or without a serial-connected interpolation filter, in any matter which achieves compatibility with a multi-bit delta-sigma signal, a multi-bit pulse code modulated signal or, through the digital delta-sigma modulator, a one-bit digital delta-sigma signal.

18. A method for converting an analog signal, comprising:
    first converting the analog signal into a multiple bit stream of delta-sigma modulated pulses; and
    second converting the multiple bit stream of delta-sigma modulated pulses into at least one bit stream of delta-sigma modulated pulses.

19. The method as recited in claim 18, further comprising interim converting the multiple bit stream of delta-sigma modulated pulses into a multi-bit pulse code modulated (PCM) signal compatible with DVD audio.

20. The method as recited in claim 18, wherein said second converting comprises quantizing either the multiple bit stream of delta-sigma modulated pulses or the multi-bit PCM signal into said one bit stream of delta-sigma modulated pulses compatible with super audio CD.

* * * * *